United States Patent

Sahbari

(10) Patent No.: US 6,432,209 B2
(45) Date of Patent: Aug. 13, 2002

(54) COMPOSITION AND METHOD FOR REMOVING RESIST AND ETCHING RESIDUES USING HYDROXYLAZMMONIUM CARBOXYLATES

(75) Inventor: Javad J. Sahbari, Sunnyvale, CA (US)

(73) Assignee: Silicon Valley Chemlabs, Sunnyvale, CA (US)

( * ) Notice: Subject to any disclaimer, the term of this patent is extended or adjusted under 35 U.S.C. 154(b) by 0 days.

(21) Appl. No.: 09/034,552

(22) Filed: Mar. 3, 1998

(51) Int. Cl.⁷ .................................................. C23G 1/02
(52) U.S. Cl. ........................................... 134/3; 510/176
(58) Field of Search ............................. 134/3; 510/176, 510/175

(56) References Cited

U.S. PATENT DOCUMENTS

| | | | |
|---|---|---|---|
| 5,279,771 A | | 1/1994 | Lee .............................. 252/548 |
| 5,308,745 A | | 5/1994 | Schwartzkopf ............. 430/329 |
| 5,334,332 A | | 8/1994 | Lee .............................. 252/548 |
| 5,381,807 A | | 1/1995 | Lee ................................ 134/2 |
| 5,399,464 A | * | 3/1995 | Lee ............................. 430/329 |
| 5,419,779 A | | 5/1995 | Ward ............................ 134/38 |
| 5,482,566 A | | 1/1996 | Lee ............................. 134/42 |
| 5,648,324 A | * | 7/1997 | Honda et al. ................ 510/176 |
| 5,665,688 A | * | 9/1997 | Honda et al. ................ 510/178 |
| 5,672,577 A | * | 9/1997 | Lee ............................. 510/175 |
| 5,780,406 A | * | 7/1998 | Honda et al. ................ 510/175 |
| 5,792,274 A | * | 8/1998 | Tanabe et al. ................ 134/1.3 |
| 5,795,702 A | * | 8/1998 | Tanabe et al. .............. 430/331 |
| 5,902,780 A | * | 5/1999 | Lee ............................. 510/176 |
| 5,911,835 A | * | 6/1999 | Lee et al. ..................... 134/1.3 |
| 5,968,848 A | * | 10/1999 | Tanabe et al. .............. 438/745 |

* cited by examiner

Primary Examiner—Randy Gulakowski
Assistant Examiner—Allan Olsen
(74) Attorney, Agent, or Firm—David Jaffer; Pillsbury Winthrop LLP

(57) ABSTRACT

A mixture of hydroxylamine partially neutralized with a weak carboxylic acid and an organic solvent such as an alkyl sulfoxide, a pyrrolidinone or a sulfone removes hardened photoresist and polymeric photoresist residues from a substrate with reduced metal corrosion.

1 Claim, No Drawings

COMPOSITION AND METHOD FOR REMOVING RESIST AND ETCHING RESIDUES USING HYDROXYLAZMMONIUM CARBOXYLATES

BACKGROUND OF THE INVENTION

1. Field of the Invention

This invention is directed to a composition and method for removal of photoresist and photoresist residues from a substrate, such as a silicon wafer. Mixtures including hydroxylamine and a weak organic acid are used to strip hard to remove photoresist materials, such as photoresist residue which has been subjected to plasma etching and post-plasma ashing. The composition and method achieve improved strip rates while significantly reducing metal corrosion.

2. Brief Description of the Prior Art

Photoresist materials are commonly used as coating masks in the fabrication of integrated circuits. During the fabrication process, photoresist materials are applied to a substrate using various techniques known in the art. The substrate, now coated with photoresist materials, is then exposed to radiation, usually in the UV, e-beam or x-ray wave lengths. After exposure, the coated substrate is developed, leaving a defined pattern of photoresist materials on the substrate. The photoresist materials that remain on the substrate after developing are used to mask the substrate for further processing. After further processing, the photoresist materials are stripped from the substrate using a photoresist stripper. Further processing of the photoresist materials after developing, such as high temperature post-exposure bake, ion implantation and deep UV radiation hardening lead to highly cross-linked photoresist polymer materials which are extremely resistant to dissolution.

The need for plasma etching or reactive ion etching of the metal, oxide, and polysilicon layers has increased. As a result of plasma etching the masking photoresist leaves a substantially hardened organometallic sidewall polymer due to a complex reaction of metallic substrate with resist polymer and halogenated plasma gas molecules. Therefore, the need for post plasma polymer removers and photoresist strippers which work effectively without damaging desired features of the microcircuit has increased.

As semiconductor manufacturing has moved into sub-micron geometries, the need for photoresist and polymer removers which work effectively without damaging desired features of the circuit has increased. Since about 1990, mixtures of hydroxylamine with alkanolamines have been introduced to facilitate the removal of hardened photoresist polymer residues and for stripping. See U.S. Pat. Nos. 5,279,771; 5,334,332, 5,381,807; 5,419,779; and 5,482,566. The alkaline strippers mentioned above may be effective in removing hardened photoresist from substrates, however, in removing post-plasma etch cross-linked organometallic polymer residues from sub-micron geometries they cause undesirable side effects. The use of these alkaline strippers and polymer removers on microcircuit substrates containing metal films, particularly aluminum or various combinations or alloys of active metals such as aluminum or titanium with more electropositive metal such as copper or tungsten, has proven problematic, even without plasma treatment, because of metal corrosion. This problem has been addressed by employing intermediate rinses with non-alkaline organic solvents such as isopropyl alcohol, other alcohols, or glycols, but such rinses add to the expense and complexity of the manufacturing process. Moreover, hydroxylamine/alkanolamine mixtures in an aqueous media undergo thermal decomposition, generating an unstable product.

Schwartzkopf, U.S. Pat. No. 5,308,745, has addressed metal corrosion with photoresist stripper compositions containing stripping solvents such as n-methylpyrrolidinone, an alkaline amine such as an aminoalkanol, and a weak acid. However, these compositions are not effective for polymer removal.

At present, there is a trend toward use of 100% copper in metal layers. Since copper is more subject to corrosion than the metals previously used, the need has increased for a non-corrosive polymer and photoresist remover.

SUMMARY OF THE INVENTION

It is an object of the present invention to provide a photoresist stripper which is environmentally friendly, stable, and does not require intermediate rinses to avoid metal corrosion and which still effectively strips plasma treated or hardened photoresist and polymeric residues.

Another object of this invention is to provide a method for photoresist and polymer removal which can avoid oxygen ashing.

A further object of this invention is to provide such improved non-metal corroding stripper compositions without any undue adverse effect on strip rate of the photoresist for cross-linked or hardened photoresist.

Another object of this invention is to provide a photoresist stripper and post-plasma polymer remover that is stable, having extended bath life without any adverse effect of ambient temperature variations on stability and effectiveness of the stripping composition.

Another object of this invention is to provide a universally accepted photoresist stripper and post plasma polymer remover that does not contain any toxic additives such as catechol, works effectively on all post plasma etch processes independent of the dry etch equipment or the type of plasma gas used in processing, and is not corrosive to sensitive metal layers.

Briefly, the preferred embodiment of the present invention utilizes a mixture of hydroxylamine partially neutralized with a weak carboxylic acid and a biodegradable organic solvent such as an alkyl sulfoxide, a pyrrolidinone or a sulfone to remove hardened photoresist and photoresist residues from a substrate with reduced metal corrosion.

DESCRIPTION OF THE PREFERRED EMBODIMENT

This invention provides a composition and a method for stripping photoresist and photoresist residues from a substrate, even if the photoresist has been baked and exposed to short wavelength hardening radiation. The composition exhibits short stripping times, long effective bath life, reduced corrosion of metals, is effective to strip both photoresist and polymer residues (thereby avoiding oxygen ashing, which is required for other compositions), and is thermally stable for long shelf life. These stripping composition is comprised of:

(a) from 5% to 50% by weight of a 50% hydroxylamine/50% water solution;

(b) from 0.1% to 25% weight of a monoprotic or diprotic carboxylic acid with four or fewer carbon atoms, such as formic, acetic, propionic acid and the like; and (c) the remainder is an organic solvent system with components such as dimethylsulfoxide (DMSO), n-hydroxyethyl-pyrrolidinone (HEP), n-methylpyrrolidinone (NMP), other pyrrolidinones, tetramethylene sulfone (sulfolane), or other alkyl sulfoxide or sulfone compounds.

It is more preferred that the composition contains 20–30% by weight of hydroxylamine/water solution, sufficient carboxylic acid component to reduce the pH to below 8, and the remainder of the solvent component.

Table 1 shows compositions which were used for tests 1 to 24 described in Table 2. The last column of Table 1 shows summary performances of the compositions for polymer cleaning and metal corrosion (on a scale of 1–5, where 1 is best and 5 is worst).

TABLE 1

| | NH$_2$OH/H$_2$O (50—50) | Acid | Solvent | H$_2$O | PH/Overnight | Stabilizer | Polymer clean/ corrosion |
|---|---|---|---|---|---|---|---|
| 1. | 30% | 0% | 35% Sulfolane 35% HEP | — | 9.77/9.90 | 1.5% TBC | —/5 |
| 2. | 29% | 1% Formic | 35% Sulfolane 35% HEP | — | 7.72/8.04 | 1.5% TBC | —/4.8 |
| 3. | 28% | 2% Formic | 35% Sulfolane 35% HEP | — | 7.40/7.73 | 1.5% TBC | —/4.5 |
| 4. | 25% | 5% Formic | 35% Sulfolane 35% HEP | — | 6.87/7.24 | 1.5% TBC | 1/1 |
| 5. | 22.5% | 7.5% Formic | 35% Sulfolane 35% HEP | — | 6.57/6.87 | 1.5% TBC | 1/2 |
| 6. | 20% | 10% Formic | 35% Sulfolane 35% HEP | — | 6.20/6.54 | 1.5% TBC | 1/2 |
| 7. | 16.66% | 13.34% Formic | 35% Sulfolane 35% HEP | — | 4.72/5.36 | 1.5% TBC | 1/2.5 |
| 8. | 25% | — | 62.5% DGA | 12.5% | 11.92/11.96 | 5% Catechol | 3/3 |
| 9. | 25% | — | 62.5% IPA | 12.5% | 11.94/11.97 | 5% Catechol | 3/3 |
| 10. | 25% | — | 62.5% MEA | 12.5% | 11.96/11.98 | 5% Catechol | 3/3 |
| 11. | 15% DNH$_2$OH | — | 42.5% Sulfolane 42.5% HEP | — | 9.65/10.04 | — | 5/4 |
| 12. | — | 10% Formic | 45% Sulfolane 45% HEP | — | 2.56/2.76 | — | 4/— |
| 13. | 22.5% | 7.5% Formic | 35% Sulfolane 35% NMP | — | 6.64/6.74 | 1.5% TBC | 1/2 |
| 14. | 20% | 10% Acetic | 35% Sulfolane 35% NMP | — | 6.72/-6.84 | 1.5% TBC | 1/2 |
| 15. | 30% | 0% | 70% DMSO | — | 9.82/9.94 | — | 2/2 |
| 16. | 30% | 5% Formic | 65% DMSO | — | 6.58 | — | 1/1 |
| 17. | 30% | 0% | 35% DMSO 35% HEP | — | 8.52 | 1% TBC | 1/2 |
| 18. | 25% | 5% Formic | 35% DMSO 35% HEP | — | 6.25 | 1% TBC | 1/1 |

In Table 1, NH$_2$OH/H$_2$O refers to a 50% NH$_2$OH/50% H$_2$O solution (available as FH-50 from Howard Hall Division, R. W. Greef & Co.), DNH$_2$OH refers to dehydrated hydroxylamine (less than 5% water), DGA is diglycolamine, IPA is isopropanolamine, MEA is monoethanolamine, DMSO is dimethylsulfoxide, HEP is n-hydroxyethyl-pyrrolidone, NMP is n-methylpyrrolidone, TBC is tertiary butyl catechol (a corrosion inhibitor), and the pH is measured at 19:1 volume dilution at the time of preparation and after being left overnight. The percentages are by weight, with the NH$_2$OH/H$_2$O, acid, solvent and water totaling 100%, and the corrosion inhibitor in addition to this.

Table 2 describes tests on wafers from UMC (Taiwan) Fab III, covered with TOK IP 2550 photoresist and dry etched with Lam Research (TCP 9600) and Applied Materials (P5000) plasma metal etchers. "PR" refers to tests in which the photoresist has not been etched, but is removed with the test solution. The tests described are for metal films with TiN (500 Å) on Al/Cu (8000 Å) on Ti/TiN (1200 Å).

The test solution was heated to the process temperature (70° C.). The test wafer was immersed in the test solution for the specified time, transferred into an isopropanol bath at room temperature for 2 minutes, rinsed with deionized water, and blow dried with nitrogen gas. The wafer inspection was under microscope (400×) or field emission scanning electron microscope (FESEM) (JEOL 6320F).

TABLE 2

| Test No. | Wafer Type (Metal Etcher) | Sol'n No. | Temp (° C.) | Time (min) | Result |
|---|---|---|---|---|---|
| 1 | TCP 9600 | 1 | 70 | 20 | After 14 min metal line began to lift off. After 20 min 90% metal line lifted off |
| 2 | TCP 9600 | 2 | 70 | 20 | After 16 min metal line began to lift off. After 20 min 60% metal line lifted off |
| 3 | TCP 9600 | 3 | 70 | 20 | After 18 min metal line began to lift off. After 20 min 20% metal line lifted off |
| 4 | TCP 9600 | 4 | 70 | 30 | No visible change. From SEM, no sidewall polymer was found and no attack on metal line. |
| 5 | TCP 9600 | 5 | 70 | 30 | No visible change. From SEM, no sidewall polymer was found but slight etching on Al/Cu layer |
| 6 | TCP 9600 | 6 | 70 | 30 | No visible change. From SEM, no sidewall polymer but slight etching on Al/Cu layer |
| 7 | TCP 9600 | 7 | 70 | 30 | No visible change. From SEM, no sidewall polymer but etching on Al/Cu layer |
| 8 | TCP 9600 | 8 | 70 | 30 | No visible change. From SEM, 80% sidewall polymer was clean and little etching on Ti/TiN bottom layer |
| 9 | TCP 9600 | 9 | 70 | 30 | No visible change. From SEM, 80% sidewall polymer was clean and little etching on Ti/TiN bottom layer |

TABLE 2-continued

| Test No. | Wafer Type (Metal Etcher) | Sol'n No. | Temp (° C.) | Time (min) | Result |
|---|---|---|---|---|---|
| 10 | TCP 9600 | 10 | 70 | 30 | No visible change. From SEM, 90% sidewall polymer was clean and some corrosion on Al/Cu layer, some etching on Ti/TiN bottom layer |
| 11 | TCP 9600 | 11 | 70 | 30 | No visible change. From SEM, <10% sidewall polymer was clean and no attack |
| 12 | TCP 9600 | 12 | 70 | 30 | No visible change. From SEM, 40% sidewall polymer was clean and no attack |
| 13 | P 5000 | 6 | 70 | 120 | No visible change under microscope (400X). No metal lift off |
| 14 | P 5000 | 8 | 70 | 120 | After 60 min metal line started to lift off, and metal line was 100% lifted off after 2 hr |
| 15 | P 5000 | 9 | 70 | 120 | After 60 min metal line started to lift off, and metal line was 100% lifted off after 2 hr |
| 16 | P 5000 | 10 | 70 | 120 | After 60 min metal line started to lift off, and metal line was 100% lifted off after 2 hr |
| 17 | P 5000 | 13 | 70 | 30 | No visible change. From SEM, 100% sidewall polymer was clean and no etching on Ti/TiN bottom layer |
| 18 | P 5000 | 14 | 70 | 30 | No visible change. From SEM, 100% sidewall polymer was clean and no etching on Ti/TiN bottom layer |
| 19 | P 5000 | 13 | 70 | 120 | No visible change under microscope (400x). No metal lift off |
| 20 | P 5000 | 14 | 70 | 120 | No visible change under microscope (400x). No metal lift off |
| 21 | w/PR | 5 | 70 | 30 | Photoresist was peeled-off in 2 min |
| 22 | w/PR | 10 | 70 | 30 | Photoresist was peeled-off in 5 min |
| 23 | w/PR | 12 | 70 | 30 | Photoresist was peeled-off in 8 min |
| 24 | w/PR | 13 | 70 | 30 | Photoresist was peeled-off in 5 min |
| 25 | P 5000 | 16 | 70 | 120 | From SEM, 100% sidewall polymer was cleaned and no metal corrosion |
| 26 | P 5000 | 17 | 70 | 120 | From SEM, 100% sidewall polymer was cleaned, slight corrosion on Ti layer, no metal lift off |
| 27 | P 5000 | 18 | 70 | 120 | From SEM, 100% sidewall polymer was cleaned, slight corrosion Ti layer, no metal lift off |

The test data summarized in Table 2 demonstrate the effective stripping capacity of the composition while avoiding metal corrosion:

1. Tests 1, 2 and 3 show that the gradual addition of formic acid to a hydroxylamine, sulfolane, HEP solution reduces the lift off of metal lines.

2. Tests 4 through 7 show that sidewall polymers can be 100% cleaned by solutions 4 through 7. The more acidic of these solutions, 6 and 7, show some etching on an aluminum/copper layer. Solutions 8, 9, and 10, known in the prior art, show some metal etching and inadequate sidewall polymer removal. Tests 4 to 7 also show that as the solution becomes more acidic, it will attack an Al—Cu layer. The preferred formulation is the solution which is closest to neutral (pH 7).

3. Tests 11 and 12 illustrate that reduction of the amount of water or hydroxylamine, respectively, in the composition results in inadequate cleaning of sidewall polymer.

4. Tests 13 through 16 show that the solution of the present invention is less corrosive than solutions using hydroxylamine and monoethanolamine, isopropanolamine or diglycolamine.

5. Tests 17 and 18 show that a solution using n-methylpyrrolidinone (NMP) instead of HEP is an effective cleaner for sidewall polymer.

6. Test 18 shows that acetic acid is an effective substitute for formic acid.

7. Tests 19 and 20 show that the solutions of tests 17 and 18 do not lift off metal lines after 120 minutes at 70° C.

8. Tests 21 to 24 show that photoresist stripping time for the compositions of the present invention are comparable to those for a photoresist stripper using hydroxylamine, monoethanolamine, and water.

9. Tests 25–27 show that addition of formic acid to a hydroxylamine/DMSO solution or a hydroxylamine/DMSO/HEP solution reduces the lift off of metal lines, and effectively removed sidewall polymer.

10. A copper corrosion test was conducted by placing pieces of copper foil in solutions 5 and 8 for 24 hours at room temperature. After 24 hours, the copper concentration for solution 5 was 360 ppm and the copper concentration for solution 8 was 2,500 ppm measured by an HP-4500 ICP/MS spectrometer. This result is particularly significant for circuit designs which use primarily copper as a metal. Recent trends in technology are leading to use of 100% copper as the metal layer for semiconductor designs (instead of aluminum/copper).

Although a preferred embodiment of the present invention has been described above, it will be appreciated that certain alterations and modifications thereof will be apparent to those skilled in the art. It is therefore intended that the appended claims be interpreted as covering all such alterations and modifications as fall within the true spirit and scope of the invention.

What is claimed is:

1. A method for removing photoresist and photoresist residues from a substrate, comprising contacting said substrate with a stripping solution for a time sufficient to remove the photoresist or residues from said substrate, wherein the stripping solution consists of:

(a) from 10% to 20% by weight hydroxylamine;

(b) from 10% to 20% by weight water;

(c) from 0.1% to 25% by weight of a monoprotic or diprotic carboxylic acid with four or fewer carbon atoms, wherein the acid is present in an amount sufficient to yield a pH between 6 and 7.5, when the pH is measured in water at 19:1 dilution;

(d) from 40% to 79% by weight of an organic solvent selected from the group consisting of dimethyl sulfoxide, tetramethylene sulfone, n-hydroxethylpyrrolidinone, and n-methylpyrrolidinone, wherein the weight percentages of (a), (b), (c), and (d) total 100%, plus an additional 1.5% to 5% by weight of a corrosion inhibitor selected from the group consisting of tertiary butyl catechol and catechol.

* * * * *